United States Patent [19]
Lee

[11] Patent Number: 5,986,965
[45] Date of Patent: Nov. 16, 1999

[54] METHOD AND DEVICE FOR WRITING DATA IN NON-VOLATILE MEMORY CIRCUIT

[75] Inventor: Byung Il Lee, Daejeon-Si, Rep. of Korea

[73] Assignee: LG Semicon Co. Ltd., Chungcheongbuk-do, Rep. of Korea

[21] Appl. No.: 08/896,985

[22] Filed: Jul. 18, 1997

[30] Foreign Application Priority Data

Sep. 13, 1996 [KR] Rep. of Korea ................. 96-39726

[51] Int. Cl.[6] ............................................. G11C 7/00
[52] U.S. Cl. ............................... 365/230.06; 365/185.11
[58] Field of Search ........................ 365/185.11, 230.03, 365/230.06; 711/5, 103

[56] References Cited

U.S. PATENT DOCUMENTS

| | | | |
|---|---|---|---|
| 5,422,856 | 6/1995 | Sasaki et al. | 365/230.03 |
| 5,488,711 | 1/1996 | Hewitt et al. | 711/103 |
| 5,548,741 | 8/1996 | Watanabe | 711/115 |
| 5,696,929 | 12/1997 | Hasbun et al. | 711/103 |

OTHER PUBLICATIONS

H. Onoda, et al., A Novel Cell Structure Suitable for A 3 Volt Operation, Sector Erase Flash Memory, 1992, IEEE Tech Dig. Of IEDM, P. 599–602.

R. Rofan, et al., Stress–Induced Oxide Leakage, 1991, IEEE EDL, vol. 12 No. 11, P. 632–634.

Primary Examiner—Jack A. Lane
Attorney, Agent, or Firm—Morgan, Lewis & Bockius LLP

[57] ABSTRACT

A device for writing a data in a non-volatile memory circuit having a plurality of memory cells includes an input/output port inputting and outputting an address and the data, a first decoder decoding the address from the input/output port and outputting a first decoded data, a second decoder decoding the data from the input/output port, sequentially determining a block value corresponding to the address from the input/output port, and outputting a second decoded data, a data processing part receiving and processing the second decoded data from the second decoder and outputting an address bit value, a first DEMUX receiving the address bit value from the data processing part and outputting a demultiplexed data corresponding to the block value determined in the second decoder, a NOR gate part receiving the first decoded data from the first decoder and the demultiplexed data from the first DEMUX, and outputting a signal having a logical NOR result, a second DEMUX receiving an output signal from the data processing part and outputting a demultiplexed data, and read/write device receiving the demultiplexed data and writing the data in the plurality of memory cells.

8 Claims, 5 Drawing Sheets

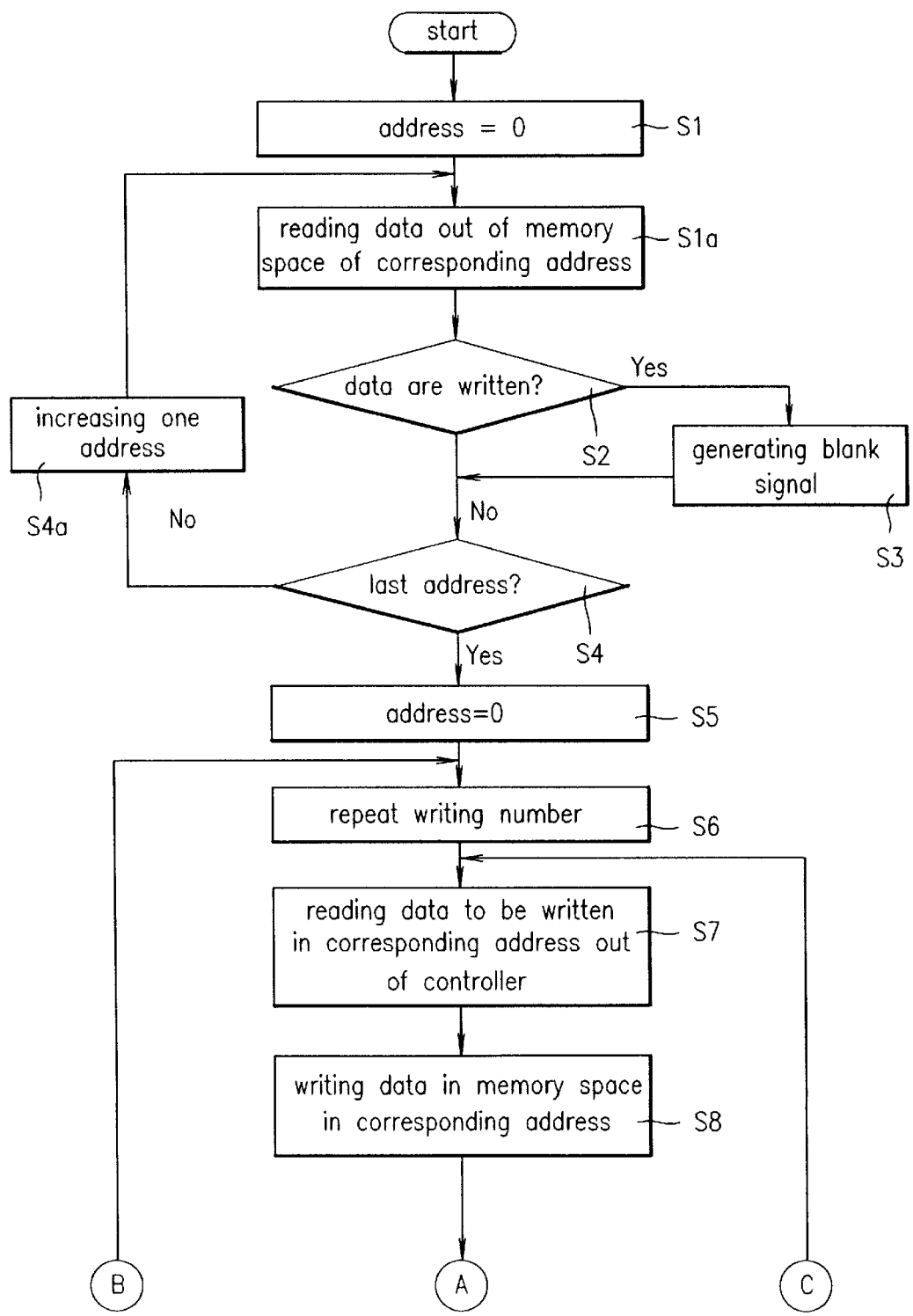

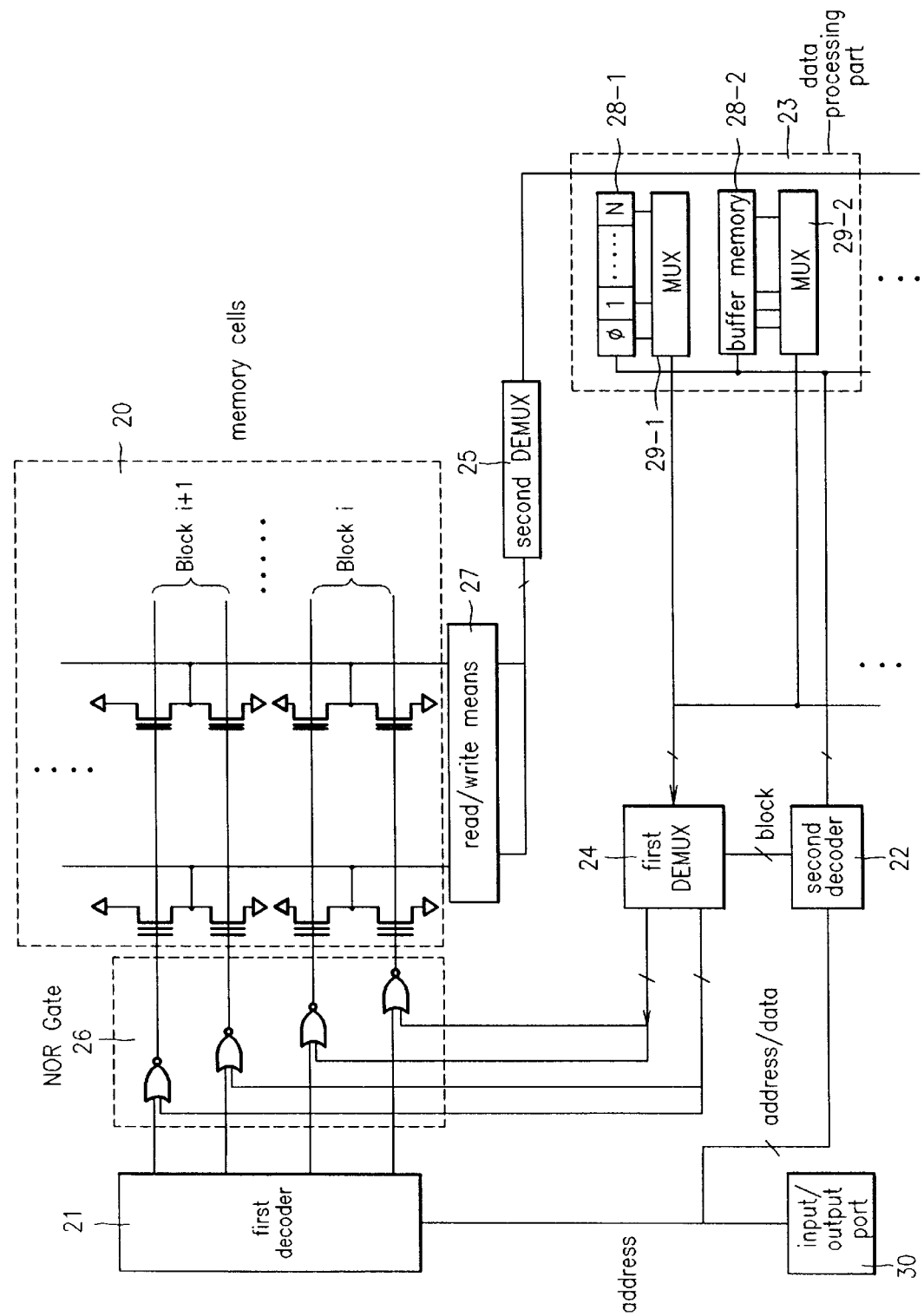

METHOD AND DEVICE FOR WRITING DATA IN NON-VOLATILE MEMORY CIRCUIT

This application claims the benefit of Korean Application No. 39726/1996 filed on Sep. 13, 1996, which is hereby incorporated by reference.

BACKGROUND OF THE INVENTION

1. Field of the Invention

The present invention relates to a semiconductor memory circuit, and more particularly, to a method and device for writing data in a non-volatile memory circuit. Although the present invention is suitable for a wide scope of applications, it is particularly suitable for reducing data writing time in the non-volatile memory circuit.

2. Discussion of the Related Art

In general, a semiconductor memory circuit can be classified into two categories: a volatile memory circuit and a non-volatile memory circuit. Data in the volatile memory circuit can be erased and the memory circuit can be reprogrammed whereas data in the non-volatile memory circuit remains intact regardless of whether the memory circuit's power supply is removed.

The volatile memory circuit typically employs a random access memory (RAM). The non-volatile memory circuit typically employs a read only memory (ROM), an erasable and programmable read only memory (EPROM), or an electrically erasable and programmable read only memory (EEPROM).

In the non-volatile memory circuits, the ROM cannot be reprogrammed once data has already been stored therein. On the other hand, data in the EPROM and EEPROM can be erased and the EPROM and EEPROM can be programmed with new data. Writing data in the non-volatile memory circuit is executed by simultaneously inputting to the memory circuit an address and desired data.

A conventional method of writing data in a non-volatile memory circuit will now be described with reference to FIGS. 1A and 1B.

As illustrated in FIG. 1A, in step S1, an address is initialized. In step S1a, the memory space corresponding to the address is read. In step S2, it is determined if data is already written in the read memory space. If data is written in the read memory space, a blank signal is generated (step S3) to thereby exclude that memory space from available memory spaces for writing data. If no data is written in the memory space or after step S3, it is determined if the address is the last address of the memory, in step S4. If the address is not the last address, step S4a is executed by increasing the address by one and steps S1a–S4 are carried out again.

Next, a data writing operation is performed. Specifically, in step S5, the address is initialized as the initial address of the memory space. In order to write data in the memory space corresponding to the address, an iteration value is initialized in step S6. Unless the iteration value is initialized, the data writing operation will be repeated continuously. Therefore, the iteration value is initialized to thereby restrict the repeat-writing number. The data is then read out of the controller that contains the data. to be written to the memory, as shown in step S7. In step 8, the read-out data are written in the memory space corresponding to the address. The data writing operation takes a $\mu$s unit of time. In step S9, it is determined if the data written in the memory space by the data writing operation is the same as the data read out of the controller. The operation of reading data out of the controller takes a $\mu$s unit of time. When the written data is not the same as the read-out data, the data writing operation (step S8) and the data comparing/determining operation (step S9) are repeated until the current repeat writing number is the same as the predetermined repeat-writing number in steps S10 and S11. In step S10, if the current repeat writing number is the same as the predetermined repeat-writing number, a data writing operation error signal is generated. Such a data writing operation error may be the result of a defect of the memory cell.

In steps S12 and S13, the data is written in the blank memory at increasing addresses by repeating the operations of steps S6 to S11. After completing the writing operation of the entire data, the address is initialized again in step S14 in preparation for the following data verifying step.

In step S15, data written in the memory space corresponding to the address and the data contained in the controller is read out. In step S16, it is determined if the data is identical to each other. The data verifying operation is repeated up to the last address while increasing the address by one in steps S18 and S18a. If the data is not the same as each other in the comparing/determining operation (step S9), a verification error signal is generated in step S17. The writing data operation in the memory circuit is completed upon completion of the verifying step.

In the above mentioned conventional operation of writing data in a non-volatile memory circuit, it takes about 20 minutes to write 1 mega byte of data. However, the conventional data writing method has problems because the data are sequentially read out of the controller by the data unit and written in the memory space corresponding to the address. Since the operation is repeated for every address of the memory, and it takes $\mu$s unit of time to write data corresponding to one address, the data writing operation takes a long time to complete.

SUMMARY OF THE INVENTION

Accordingly, the present invention is directed to a method and device for writing data in a non-volatile memory circuit that substantially obviates one or more of the problems due to limitations and disadvantages of the related art.

An object of the present invention is to provide a method and device for writing data in a non-volatile memory circuit that drastically decreases the time taken to write data.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a device for writing data in a non-volatile memory circuit of the invention includes a second decoder determining a block value according to an address, sequentially decoding the data inputted through an input/output port, and outputting the decoded data, a data processing part consisting of a buffer memory storing data outputted through the second decoder and MUX multiplexing the address bit value of the buffer memory and then outputting it, and outputting the bit value of the buffer memory address, a first DEMUX demultiplexing the bit data of the corresponding address of the buffer memory, and outputting the demultiplexed data to the cell of the corresponding block according to the block value determined in the second decoder, a second DEMUX demultiplexing the data of the data processing part, and outputting the demultiplexed data, a first decoder decoding the address outputted through the input/output port, and outputting the decoded data, a NOR gate part performing a NOR operation with the decoded value of the first decoder and the bit value of the first DEMUX, and then outputting the NORed value to each word line, and read/write means for writing the data value output through the second DEMUX in each cell.

In another aspect of the present invention, a device for writing a data in a non-volatile memory circuit includes a plurality of memory cells storing the data in the non-volatile memory circuit, and a temporary storing means arranging the data into a plurality of unit blocks to write the data in a specific unit of the plurality of memory cells in corresponding addresses.

In a further aspect of the present invention, a data writing method of a non-volatile memory circuit having a buffer memory, the method includes the steps of arranging the data into a unit block of the buffer memory and storing the data thereof, writing the data into a memory cell of the non-volatile memory circuit corresponding to a buffer memory address, verifying the data written in the memory cell corresponding to the buffer memory address, and repeating the steps of arranging and writing the data until the data is written in all unit blocks corresponding to the buffer memory address.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings:

FIGS. 1A and 1B are flowcharts illustrating a conventional data writing operation;

FIG. 2 is a block diagram of a data writing device of the present invention.

DETAILED DESCRIPTION OF THE PREFERRED EMBODIMENTS

Figure 1B:
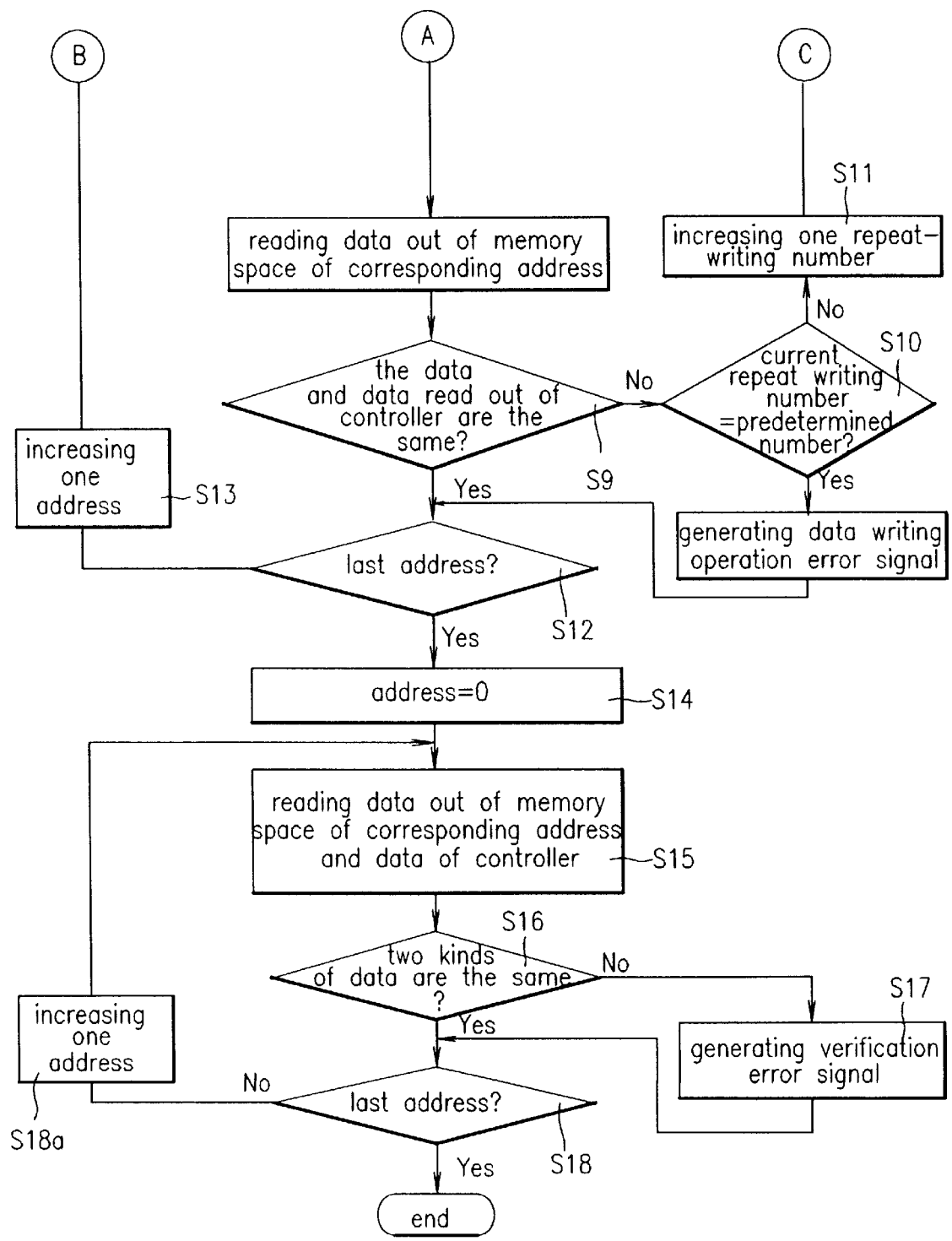

Reference will now be made in -detail to the preferred embodiments of the present invention, examples of which are illustrated in the accompanying drawings.

The data writing device of the invention comprises a plurality of buffer memories. The buffer memories arrange the data into a block by storing the data to be written in the plurality of memory cells by a specific unit. Then, the data in a block unit are written in the cell corresponding to the address.

More particularly, as illustrated in FIG. 2, the data writing device of the invention comprises a memory cell 20, a first decoder 21, a second decoder 22, a data processing part 23, a first DEMUX 24, a second DEMUX 25, a NOR gate part 26, a read/write means 27, and an input/output part 30. The data processing part 23 includes a buffer memory 28 (shown as parts 28-1 and 28-2) and a MUX 29 (shown as parts 29-1 and 29-2). The second decoder 22 determines the block value corresponding to each address, and sequentially writes the input data in the buffer memory 28 through the input/output port 30. The buffer memory 28 of the data processing part 23 stores the data outputted through the second decoder 22, and the MUX 29 multiplexes the address bit value of the buffer memory 28 and outputs the bit values of the buffer memory's addresses (address 0, 1, 2, - - - ). The first DEMUX 24 demultiplexes the bit data of the corresponding address of the buffer memory 28 and outputs the demultiplexed data to the cells of the corresponding block according to the block value determined in the second decoder 22. The second DEMUX 25 demultiplexes the data of the data processing part 23, and outputs the demultiplexed data. The first decoder 21 decodes the address outputted through the input/output port 30, and outputs the decoded data. The NOR gate part 26 performs a NOR operation with the decoded value of the first decoder 21 and the bit value of the first DEMUX, and outputs the NORed value to each word line of the memory cell 20. The read/write means 27 writes the data value outputted through the second DEMUX 25 in each cell. Here, the NOR gate part 26 includes a NOR gate for each word line of the memory cell. The buffer memory 28 comprises, for example, a static random access memory (SRAM).

Figure 3A:
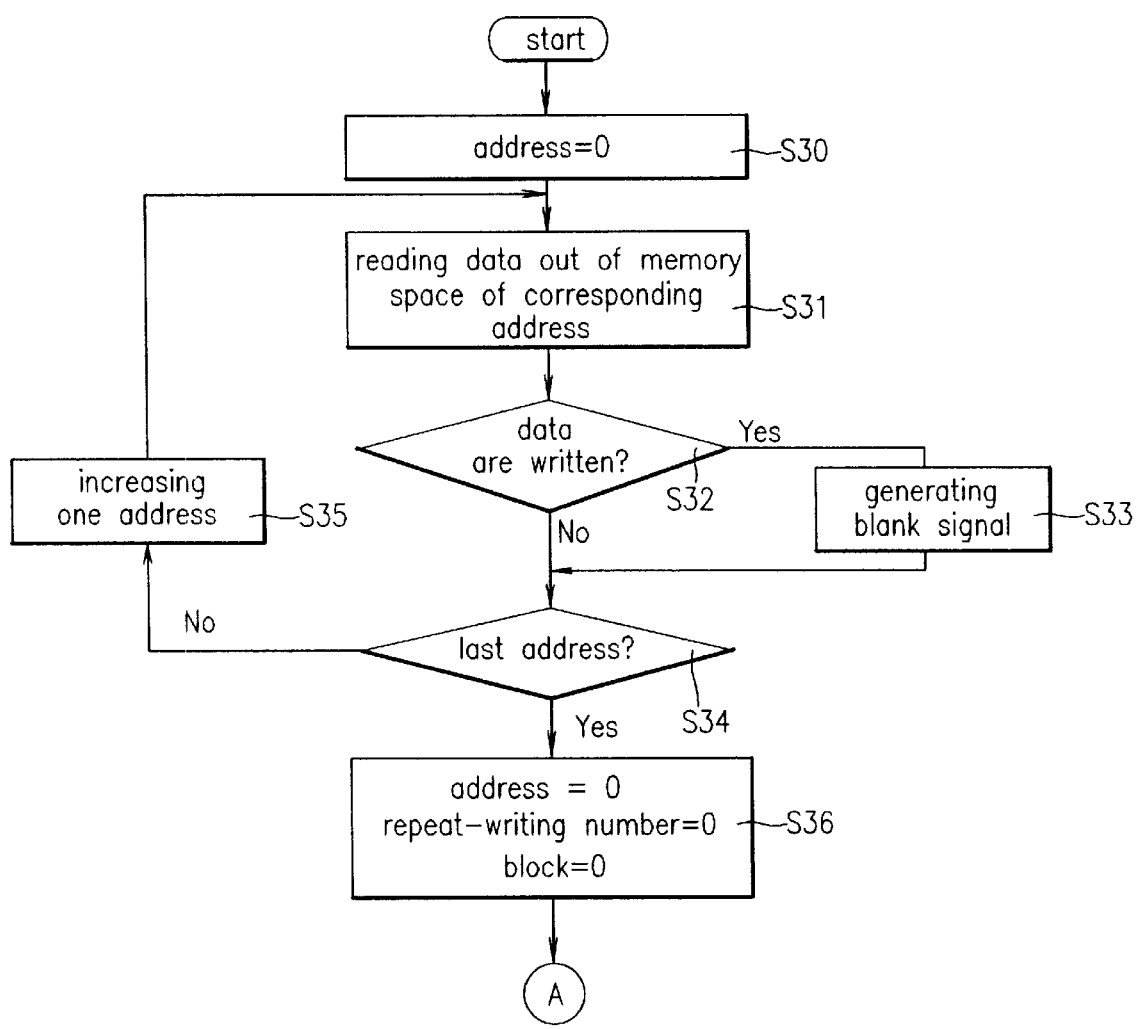
FIGS. 3A and 3B are flowcharts illustrating a data writing operation of the present invention.
Figure 3B:
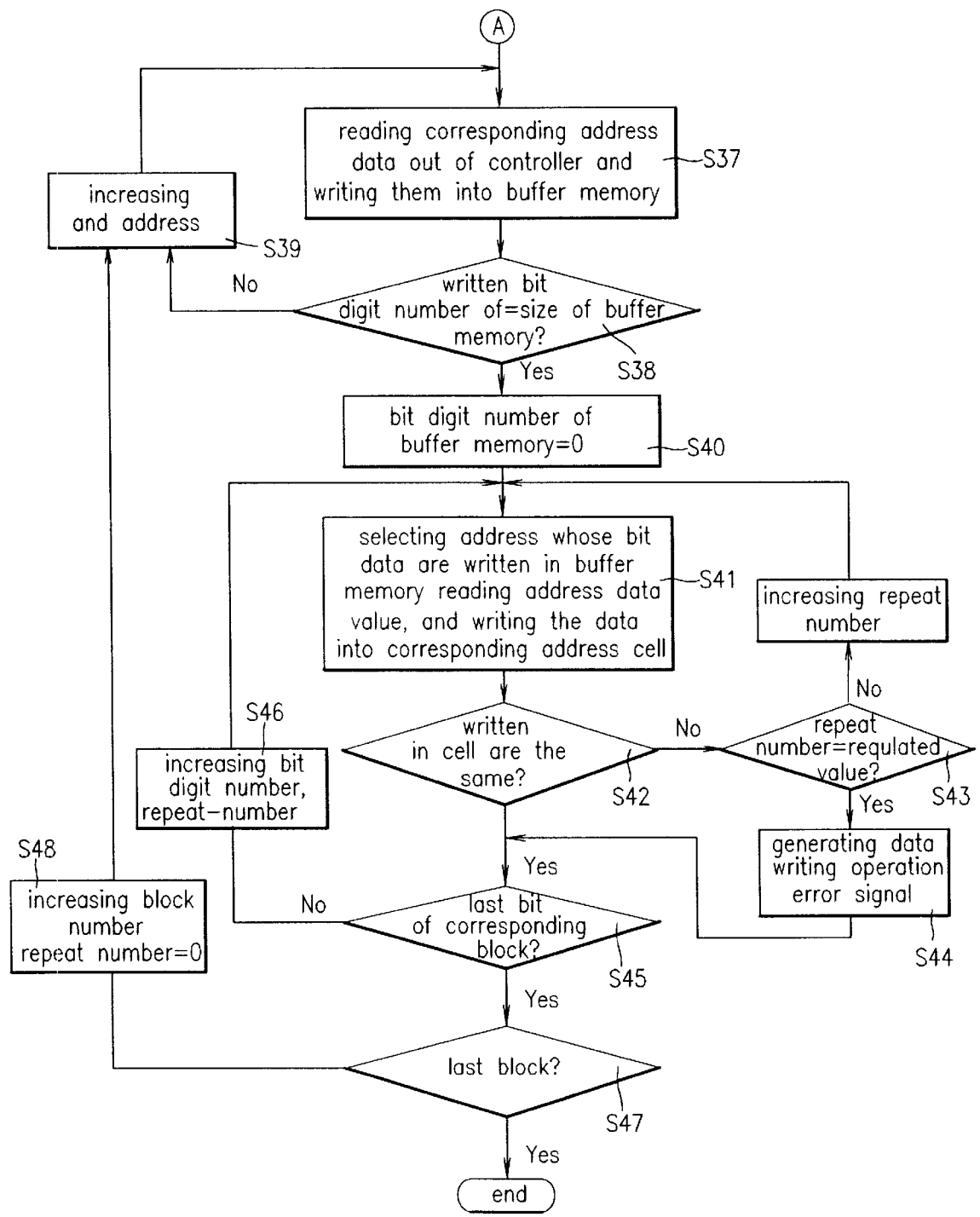

Operation of the data writing device of the present invention will now be described with reference to FIGS. 3A and 3B.

In step S30, the address is initialized. In step S31, the memory space corresponding to the address is read. In step, S32, if data is already written in the memory space, a blank signal is generated (step S33) to exclude the memory space from the data writing operation. If, in step S32, it is determined that data is not already written in the memory space or upon completion of step S33, it is determined whether the address is the last address of the memory (step S34). If, in step S34, it is determined that the address is not the last address, the address is increased by one (step S35) and process returns to step S31. If, however, it is determined in step S34 that the address is the last address, the process proceeds to step S36.

Next, a data writing operation is performed as follows.

In step S36, the address of the buffer memory 28 is initialized. The iteration value is initialized, and the block order is initialized in order to write the data sequentially by arranging the data into a unit block. If the iteration value is not initialized, the data writing operation is continuously repeated. Therefore, the initialization of the iteration value is essential to limit the number of times the data writing operation is performed.

Next, in step S37, data is read out of the controller (not shown) and written into the buffer memory 28 corresponding to the address. It is determined whether the size of the buffer memory 28 is as large as the data block to be written into the non-volatile memory circuit, as shown in step S38. In other words, the data read out of the controller is written while increasing the address to a capacity of the buffer memory by comparing the digit of the written bit with a capacity of the buffer memory.

After completing the above operation of writing the data, the bit digit of the buffer memory 28 is initialized in step S40 in order to write the data into the non-volatile memory. After selecting the address that bit data are written in the device buffer memory 28, the read address and data values are written into the non-volatile memory cell corresponding to the address in step S41. In step S42, it is determined whether the data in the buffer memory 28 corresponding to the address and the data written in cell are identical. If not, steps S41 and S42 are repeated until the repeated number becomes the same as the regulated repeating number with increasing the repeat-writing number in step S43. In case those data are not the same, the data writing operation error signal is generated in step S44.

In step S45, it is determined whether the data written into the non-volatile memory circuit are the last bit of the corresponding block. If the data are not the last bit, the repeat-writing number and the bit digit are initialized by increasing bit in step S46 to repeat the operations of S41 through S46.

Finally, if the data written into the non-volatile are the last bit, the next step is to determine whether the data are in the last block in step S47. If not, the data writing operation is repeated from the step S39 until the data are written in the last block.

In the method and device for writing data in the non-volatile memory circuit in the invention, since the data are written into a cell by arranging the data in a block as large as the capacity of the buffer memory, the data writing time is reduced. As a consequence, the amount of data processed in one operation is dependent upon a capacity of the buffer memory.

It will be apparent to those skilled in the art that various modifications and variations can be made in the device for writing data in the non-volatile memory circuit and the method of the same of the present invention without departing from the spirit or scope of the invention. Thus, it is intended that the present invention cover the modifications and variations of this invention provided they come within the scope of the appended claims and their equivalents.

What is claimed is:

1. A device for writing a data in a non-volatile memory circuit having a plurality of memory cells, comprising:
    an input/output port inputting and outputting an address and the data;
    a first decoder decoding the address from the input/output port and outputting a first decoded data;
    a second decoder decoding the data from the input/output port, sequentially determining a block value corresponding to the address from the input/output port, and outputting a second decoded data;
    a data processing-part receiving and processing the second decoded data from the second decoder and outputting an address bit value;
    a first DEMUX receiving the address bit value from the data processing part and outputting a demultiplexed data corresponding to the block value determined in the second decoder;
    a NOR gate part receiving the first decoded data from the first decoder and the demultiplexed data from the first DEMUX, and outputting a signal having a logical NOR result;
    a second DEMUX receiving an output signal from the data processing part and outputting a demultiplexed data; and
    a read/write device receiving the demultiplexed data from the second DEMUX and writing the data in the plurality of memory cells.

2. The device according to claim 1, wherein the data processing part comprises:
    a buffer memory storing the second decoded data from the second decoder; and
    a plurality of MUX multiplexing the address bit value from the buffer memory and outputting the address bit value corresponding to a buffer memory address.

3. The device according to claim 1, wherein the NOR gate part includes a plurality of NOR gates corresponding to each word line of the non-volatile memory.

4. The device according to claim 1, wherein the buffer memory includes a static random access memory (SRAM).

5. A device for writing data in a non-volatile memory circuit having a plurality of memory cells, comprising:
    an input/output port for inputting and outputting an address and the data;
    a decoder for decoding the address and the data from the input/output port, and for outputting a first decoded data and a second decoded data;
    a data processing part for processing the second decoded data from the decoder and generating a first signal and a second signal, the first signal corresponding to the address and the second signal corresponding to the data;
    a NOR gate part for receiving the first decoded data from the decoder and the first signal from the data processing part, and outputting a logical NOR result to word lines of the plurality of memory cells; and
    a read/write device for receiving the second signal from the data processing part and writing the data in the plurality of memory cells.

6. The device according to claim 5, wherein the decoder comprises:
    a first decoder for decoding the address from the input/output port and for outputting the first decoded data; and
    a second decoder for decoding the data from the input/output port, sequentially determining a block value corresponding to the address from the input/output port, and outputting the second decoded data.

7. The device according to claim 5, wherein the data processing part comprises:
    a buffer memory for storing the second decoded data from the decoder;
    a plurality of MUX for multiplexing an address bit value from the buffer memory and for outputting the address bit value corresponding to a buffer memory address;
    a first DEMUX for receiving the address bit value from the plurality of MUX and for outputting the first signal; and
    a second DEMUX for receiving an output from the buffer memory and for outputting the second signal.

8. The device according to claim 7, wherein the buffer memory includes a static random access memory (SRAM).

* * * * *